United States Patent [19]

Aso

[11] Patent Number: 5,117,134
[45] Date of Patent: May 26, 1992

[54] CMOS OR TTL TO ECL LEVEL CONVERSION DEVICE

[75] Inventor: Akira Aso, Tokyo, Japan

[73] Assignee: NEC Corporation, Tokyo, Japan

[21] Appl. No.: 573,402

[22] Filed: Aug. 24, 1990

[30] Foreign Application Priority Data

Aug. 24, 1989 [JP] Japan .................. 1-218195

[51] Int. Cl.⁵ .......................... H03K 19/092
[52] U.S. Cl. .................. 307/475; 307/570; 307/446
[58] Field of Search ............. 307/475, 570, 446, 455

[56] References Cited

U.S. PATENT DOCUMENTS

| | | | |
|---|---|---|---|
| 4,359,653 | 11/1982 | Takamasa | 307/475 |
| 4,366,397 | 12/1982 | Kitahmura et al. | 307/446 |
| 4,491,743 | 1/1985 | Smith | 307/475 |
| 4,593,211 | 6/1986 | Belforte | 307/475 |
| 4,698,527 | 10/1987 | Matsumoto | 307/475 |
| 4,877,977 | 10/1989 | Kokado | 307/455 |

Primary Examiner—David Hudspeth
Assistant Examiner—Scott A. Ouellette
Attorney, Agent, or Firm—Helfgott & Karas

[57] ABSTRACT

The semiconductor level conversion device for an ECL circuit having a pair of transistors connected commonly at their emitters. A first gate circuit is connected to apply a first output signal to a base of one of the transistors, and a second gate circuit is connected to apply a second output signal to a base of the other of the transistors. The first and second output signals are held in-phase relation to each other. The first output signal has a high logic level lower than that of the second output signal and a low logic level higher than that of the second output signal.

4 Claims, 3 Drawing Sheets

CMOS OR TTL TO ECL LEVEL CONVERSION DEVICE

SEMICONDUCTOR LEVEL CONVERSION DEVICE

The present invention relates to semiconductor integrated circuits, and more specifically relates to semiconductor level conversion devices for effecting level matching between CMOS logic etc. and ECL logic.

An ECL logic circuit receives an output from other type of logic circuits such as CMOS and TTL. As shown in FIG. 1, a pair of transistors 41 and 42 of the conventional ECL circuit are connected to each other at their emitters, and one of the transistors must be supplied with a reference voltage VR.

Otherwise, as shown in FIG. 2, there has been proposed another prior art structure where a pair of transistors 41 and 42 constitute a differential gate circuit. A base input of the transistor 41 receives one signal 46 through two stages of gate circuits 43 and 44, and another base input of the transistor 42 receives another signal 47 through one stage of gate circuit 45 so that the pair of signals 46 and 47 are in opposite phase relation to each other.

In the first-mentioned prior art which needs a reference voltage VR, a reference voltage generating circuit must be provided, thereby causing complicated lay-out problem due to additional spacing and lead patterning.

With regard to the second-mentioned prior art of the differential type using two ways of gate circuits in opposite phase relation, difference between delay times of the two gate ways unstabilizes operation of the subsequent differential gate circuit as shown in FIG. 3 particularly by portions a and b in the waveform, thereby possibly causing drawback of generating noise etc.

SUMMARY OF THE INVENTION

In view of the drawbacks of the above noted prior art, an object of the invention is to realize fast and stable logic conversion without using a reference voltage and with eliminating the problem due to delay time difference between outputs of two way gate circuits.

According to the invention, in the semiconductor level conversion device having an ECL circuit including a pair of transistors connected to each other at their emitters, a first gate circuit is provided such that its output is connected to a base of one of the transistors, and a second gate circuit is provided such that its output is connected to a base of the other of the transistors. The device is characterized in that the first and second gate circuits output signals of the same phase, and that a high level of the output signal of the first gate circuit is lower than that of the output signal of the second gate circuit while a low level of the output signal of the first gate circuit is higher than that of the output signal of the second gate circuit. By such construction, a logic signal can be smoothly transferred from TTL or CMOS to an ECL logic circuit.

DETAILED DESCRIPTION OF PREFERRED EMBODIMENTS

Figure 1:
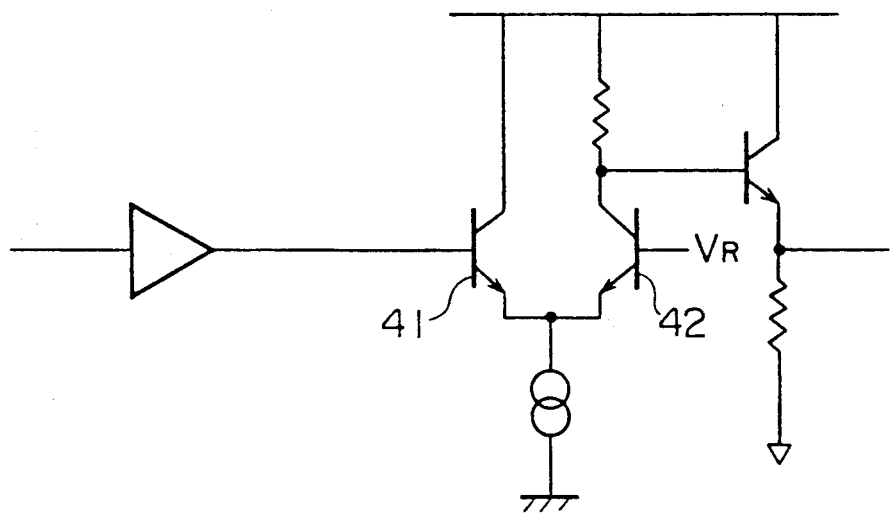
FIGS. 1 and 2 are circuit diagrams showing different types of the prior art.
Figure 2:
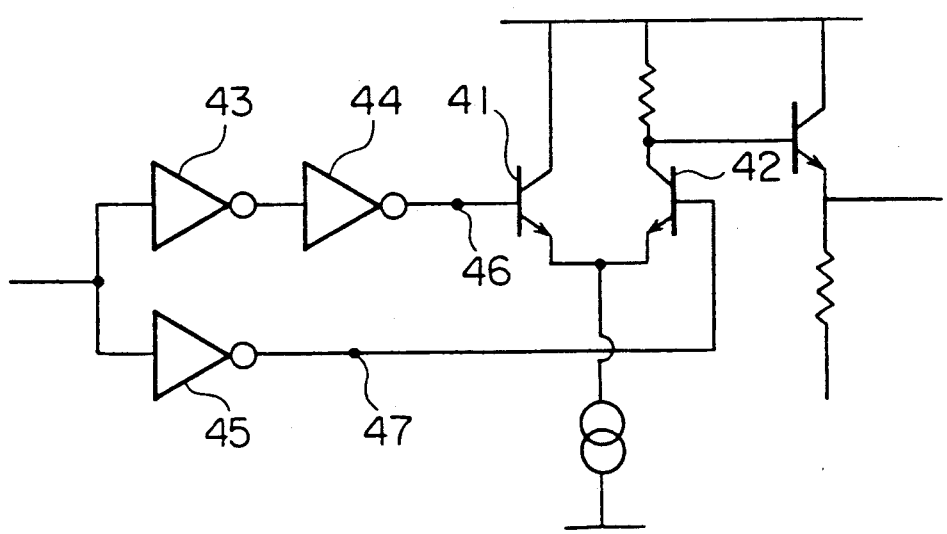
Figure 3:
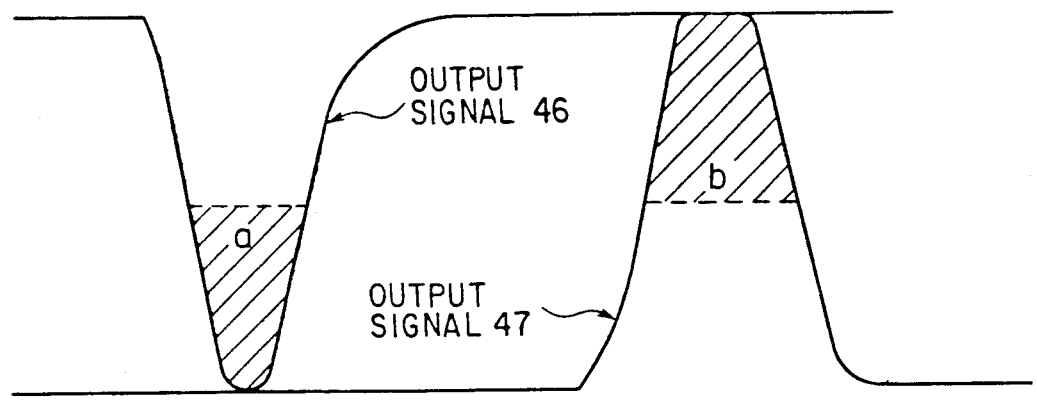
FIG. 3 is a diagram showing an output waveform of a level conversion portion of the FIG. 2 circuit.
Figure 4:
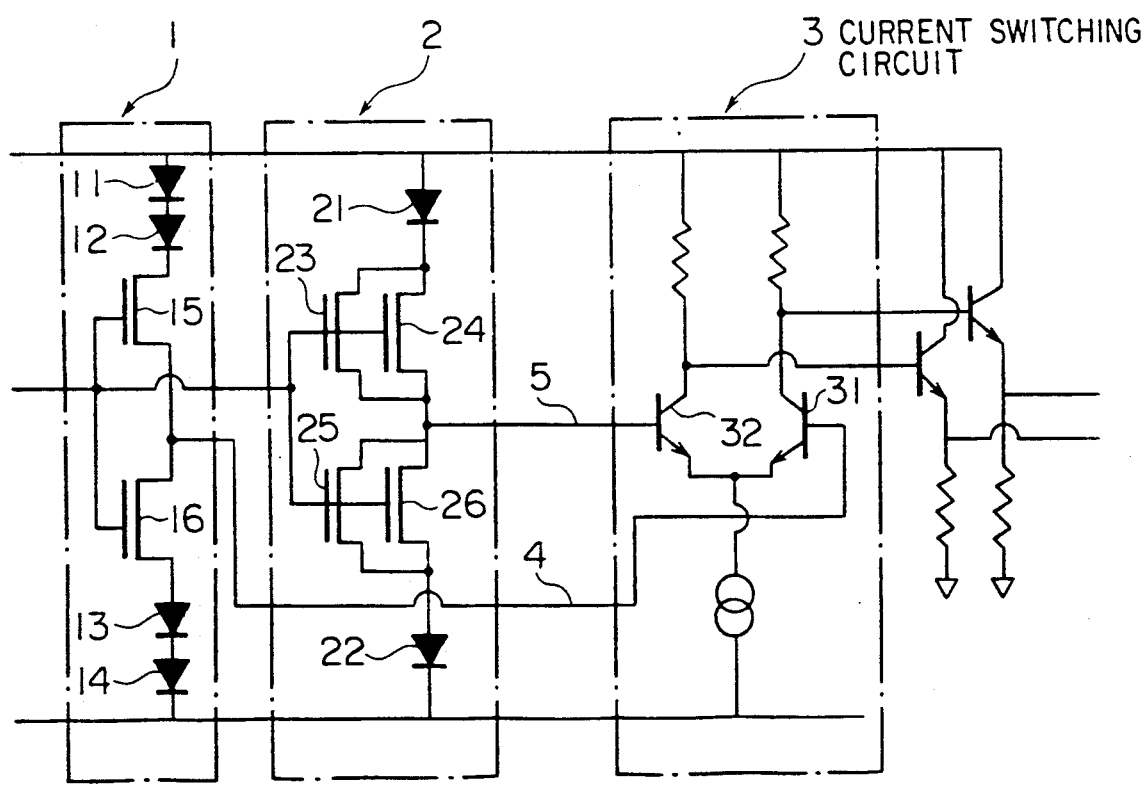
FIG. 4 is a circuit diagram showing one embodiment of the present invention.
Figure 5:
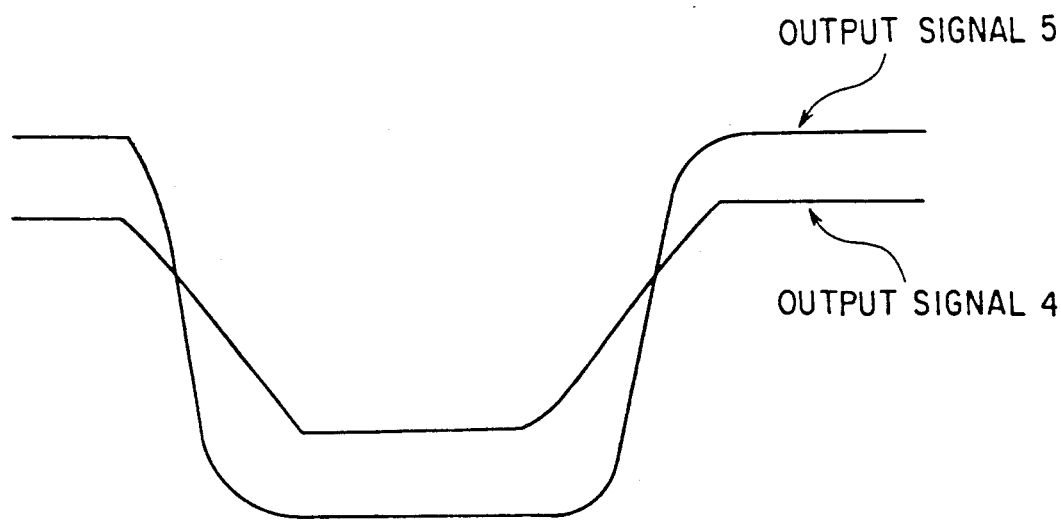
FIG. 5 is an output waveform diagram of a level conversion portion of the FIG. 4 embodiment.

FIG. 4 is a circuit diagram showing one embodiment according to the present invention. A first gate circuit 1 has a logic level amplitude controlled by a two-stage of diodes 11, 12 connected to a power source line and by another two-stage of diodes 13, 14 connected to a ground potential line, while a second gate circuit 2 has a logic level amplitude controlled by one stage of diode 21 connected to the power source line and by one stage of diode 22 connected to the ground potential line. Consequently, the logic level amplitude of the first gate circuit 1 is smaller than that of the second gate circuit 2. With regard to a delay time thereof, the first gate circuit 1 includes two transistors 15, 16 and the second gate circuit 2 includes four transistors 23, 24, 25, 26. These transistors have the same performance. Due to difference in numbers of the used transistors, the first and second gate circuits 1 and 2 have different delay times. In this embodiment, the delay time of the first gate circuit 1 is longer than that of the second gate circuit 2 so that output signals 4 and 5 of the respective gate circuits 1 and 2 are in the same phase relation to each other as shown in FIG. 5. The outputs of these two circuits 1 and 2 are connected to inputs of an electric current switching circuit 3 of the differential input type, i.e., ECL circuit. Namely, a pair of transistors 31 and 32 are commonly connected at their emitters. The output signal 4 is inputted into one transistor 31 and the output signal 5 is inputted into the other transistor 32. By adjusting the amplitude and phase as described above, the output signals 4 and 5 have waveforms as shown in FIG. 5. Namely, the output signals and 5 are held in-phase to each other. A high level of the output signal 4 is lower than that of the output signal 5, and a low level of the output signal 4 is higher than that of the output signal 5. Accordingly, the waveforms of the output signals 4 and 5 intersect each other to thereby enable stable switching of the subsequent differential gates 31 and 32. In addition, the diode contained in the second gate circuit 2 at the power source potential side can be utilized so as to avoid saturation of the transistors of the subsequent ECL circuit.

Figure 6:
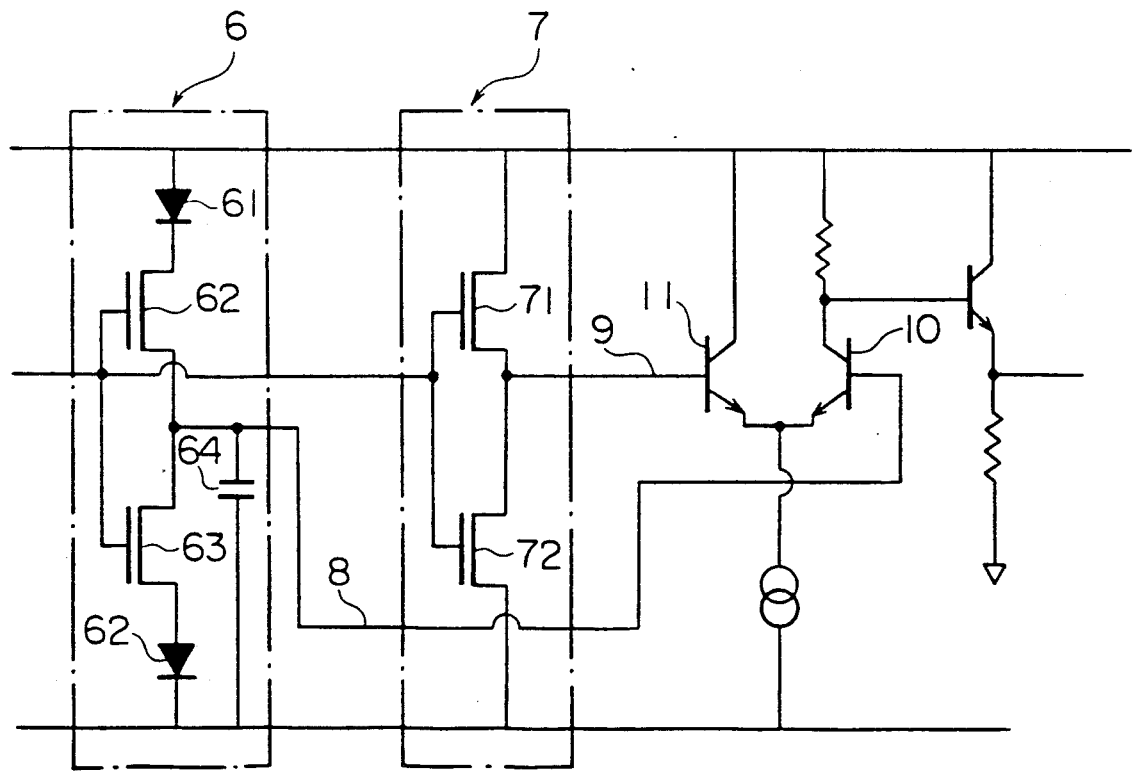
FIG. 6 is a circuit diagram showing another embodiment of the present invention.

FIG. 6 shows another embodiment of the present invention. In this embodiment, a first gate circuit 6 is provided with diodes 61 and 62 so as to effect amplitude regulation of output signals 8 and 9 between the pair of gate circuits 6 and 7, while the first gate circuit 6 and the second gate circuit 7 have the same number of transistors 62 and 63, and 71 and 72 those of which have the same driving ability. However, a capacitive load 64 is connected to an output of the first gate circuit 6 so as to differentiate transfer delay time between the pair of output signals 8 and 9 fed to a pair of transistors 10, 11 of an ECL circuit. In this embodiment, the output signals 8 and 9 have waveforms identical to those shown in FIG. 5, thereby achieving the same effect as that of the previous embodiment.

As described above, according to the present invention, the first and second gate circuits operate to regulate the amplitude and phase of signals fed to a pair of transistors of the ECL circuit. By this, logic transfer can be carried out stably, without using a reference voltage, from TTL circuit or CMOS circuit to ECL circuit. The inventive device can be advantageously utilized in a gate array designed to realize an interface to an ECL device by arranging centrally CMOS logic circuit construction and peripherally ECL circuit, or utilized in a standard cell etc.

What is claimed is:

1. A semiconductor level conversion device, comprising: an ECL circuit having a pair of transistors connected at their emitters to each other; a first gate circuit for applying an output signal to a base of one of the transistors; a second gate circuit for applying another output signal to a base of the other of the transistors; an input terminal for supplying a CMOS or TTL input to each gate circuit; and an output terminal for outputting an ECL signal from the ECL circuit; wherein the output signals are in the same phase relation to each other, and the output signal of the first gate circuit has a high level lower than a high level of the output signal of the second gate circuit and has a low level higher than a low level of the output signal of the second gate circuit.

2. A semiconductor level conversion device as in claim 1, wherein said first gate circuit has a logic level amplitude controlled by a two-stage of diodes connected to a power source line and by another two-stage of diodes connected to a ground potential line, while said second gate circuit has a logic level amplitude controlled by one stage of diode connected to the power source line and by one stage of diode connected to the ground potential line.

3. A semiconductor level conversion device as in claim 1, wherein said first gate circuit includes two transistors and said second gate circuit includes four transistors.

4. A semiconductor level conversion device as in claim 1, wherein said first gate circuit is provided with two diodes, while said first gate circuit and said second gate circuit have the same number of transistors, and those of which have the same driving ability.

* * * * *